United States Patent
Zhang et al.

(10) Patent No.: US 9,395,758 B2
(45) Date of Patent: Jul. 19, 2016

(54) BACK HOUSING AND DISPLAY DEVICE

(71) Applicants: Hisense Electric Co., Ltd., Qingdao (CN); HISENSE USA CORPORATION, Suwanee, GA (US); Hisense International Co., Ltd., Qingdao (CN)

(72) Inventors: Yong Zhang, Qingdao (CN); Wangjun Zhang, Qingdao (CN)

(73) Assignees: HISENSE ELECTRIC CO., LTD., Qingdao (CN); HISENSE USA CORPORATION, Suwanee, GA (US); HISENSE INTERNATIONAL CO., LTD., Qingdao (CN)

(*) Notice: Subject to any disclaimer, the term of this patent is extended or adjusted under 35 U.S.C. 154(b) by 22 days.

(21) Appl. No.: 14/580,465

(22) Filed: Dec. 23, 2014

(65) Prior Publication Data

US 2016/0088743 A1    Mar. 24, 2016

(30) Foreign Application Priority Data

Sep. 18, 2014 (CN) .......................... 2014 1 0477321

(51) Int. Cl.
```
G06F 1/16      (2006.01)
H05K 5/00      (2006.01)
H05K 5/02      (2006.01)
G02F 1/1333    (2006.01)
```
(52) U.S. Cl.
CPC ........ G06F 1/1652 (2013.01); G02F 1/133305 (2013.01); H05K 5/0008 (2013.01); H05K 5/0017 (2013.01); H05K 5/0234 (2013.01); *G02F 2001/133328* (2013.01); *G09G 2380/02* (2013.01)

(58) Field of Classification Search
CPC ................ G06F 1/1601; G06F 1/1652; G02F 1/133305; G02F 2001/133328; G09G 2380/02
See application file for complete search history.

(56) References Cited

U.S. PATENT DOCUMENTS

| | | | | |
|---|---|---|---|---|
| 8,559,169 B2* | 10/2013 | Takechi | ............ | G02F 1/133308 248/917 |
| 9,123,290 B1* | 9/2015 | Cho | ............ | G06F 1/1652 |
| 9,148,950 B2* | 9/2015 | Park | ............ | H04M 1/0268 |
| 2008/0024695 A1* | 1/2008 | Yan | ............ | G02F 1/133308 349/58 |
| 2008/0204987 A1* | 8/2008 | Sakata | ............ | H05K 5/02 361/679.01 |
| 2009/0154087 A1* | 6/2009 | Goto | ............ | G06F 1/1616 361/679.27 |
| 2010/0067185 A1* | 3/2010 | Liou | ............ | F16M 13/02 361/679.21 |
| 2011/0043976 A1* | 2/2011 | Visser | ............ | G09F 9/00 361/679.01 |
| 2012/0063066 A1* | 3/2012 | Floit | ............ | A45F 3/14 361/679.01 |

(Continued)

*Primary Examiner* — Adrian S Wilson
(74) *Attorney, Agent, or Firm* — Harness, Dickey & Pierce, P.L.C.

(57) ABSTRACT

A back housing applicable to a curvature-adjustable display device is disclosed, wherein the back housing includes at least three housing bodies which are vertically arranged, the housing bodies are connected by at least two types of housing connectors including a rotating connector and a sliding connector, and the housing connector between adjacent housing bodies is one of the rotating connector and the sliding connector, and wherein the rotating connector is configured to have two adjacent housing bodies connected through rotation, and the sliding connector is configured to have two adjacent bodies connected through sliding.

20 Claims, 4 Drawing Sheets

(56) References Cited

U.S. PATENT DOCUMENTS

| | | | | |
|---|---|---|---|---|
| 2013/0070407 A1* | 3/2013 | Wang | G06F 1/1637 | 361/679.26 |
| 2013/0083496 A1* | 4/2013 | Franklin | G06F 1/1626 | 361/749 |
| 2013/0134061 A1* | 5/2013 | Wu | G06F 1/1626 | 206/320 |
| 2013/0155655 A1* | 6/2013 | Lee | H05K 5/03 | 362/97.1 |
| 2013/0207946 A1* | 8/2013 | Kim | G09G 3/3225 | 345/204 |
| 2013/0321987 A1* | 12/2013 | Ore Yang | G06F 1/1628 | 361/679.01 |
| 2014/0198465 A1* | 7/2014 | Park | H05K 5/0226 | 361/749 |
| 2015/0035812 A1* | 2/2015 | Shin | G09G 3/3688 | 345/204 |
| 2015/0092346 A1* | 4/2015 | Ben | G06F 1/1626 | 361/679.55 |

\* cited by examiner

BACK HOUSING AND DISPLAY DEVICE

CROSS-REFERENCE TO RELATED APPLICATION

This application claims the benefit and priority of Chinese Patent Application No. 201410477321.0 filed Sep. 18, 2014. The entire disclosure of the above application is incorporated herein by reference.

FIELD

The present disclosure relates to the field of display technologies and particularly to a back housing and a display device.

BACKGROUND

This section provides background information related to the present disclosure which is not necessarily prior art.

Display devices include a liquid crystal display device, an LED display device, etc. The display devices can be widely applied to a television set, a computer, a PAD, a mobile phone and other terminals.

A display device typically includes a back housing which can function to hold the display device in place but also can protect some components inside the display device.

The display devices can include a flat panel display device, a curved display device, etc., where the flat panel display device can be a flat panel TV set, computer, PAD, mobile phone or another terminal, for example, and the curved display device can be a curved TV set, computer, PAD, mobile phone or another terminal, for example.

SUMMARY

This section provides a general summary of the disclosure, and is not a comprehensive disclosure of its full scope of all of its features.

In an aspect, one or more embodiments of the disclosure provide a back housing applicable to a display device, the back housing includes at least three housing bodies, which are vertically arranged, the housing bodies are connected by at least two types of housing connectors including a rotating connector and a sliding connector, and the housing connector between adjacent housing bodies is one of the rotating connector and the sliding connector, and the rotating connector is configured to have two adjacent housing bodies connected through rotation, and the sliding connector is configured to have two adjacent housing bodies connected through sliding.

In another aspect, one or more embodiments of the disclosure further provide a back housing applicable to a display device, the back housing includes at least three housing bodies, which are connected by connectors to constitute the back housing, length directions of the housing bodies are along a length direction of the back housing, width directions of the housing bodies are along a width direction of the back housing, adjacent housing bodies are connected by the connectors, lengths of the housing bodies are no larger than a length of the back housing, widths of the housing bodies match with a width of the back housing, and thicknesses of the housing bodies are no larger than a thickness of the back housing.

Moreover one or more embodiments of the disclosure further provide a display device with a back housing, the back housing includes at least three housing bodies, which are connected by connectors to constitute the back housing, length directions of the housing bodies are along a length direction of the back housing, width directions of the housing bodies are along a width direction of the back housing, adjacent housing bodies are connected by the connectors, lengths of the housing bodies are no larger than a length of the back housing, widths of the housing bodies match with a width of the back housing, and thicknesses of the housing bodies are no larger than a thickness of the back housing.

Further areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

One or more embodiments of the disclosure provide a back housing applicable to a display device, the display device may be a flat panel display device or a curved display device, and furthermore the display device may be a curvature-invariable display device or a curvature-adjustable display device.

In one or more embodiments of the disclosure, the housing is designed to a segmented structure with its body including at least three housing bodies which are vertically arranged, and the adjacent housing bodies may be rotated or slid relative to each other through a rotating connector and/or a sliding connector between the adjacent housing bodies so that the back housing may be changed in shape, length or the like.

In order to better understand these embodiments, the technical solutions may be described below with reference to the drawings and some embodiments thereof only by way of an example where they are applicable to a curved display device although they may also be applicable to a flat panel display device without departing from the principle thereof.

Figure 1:
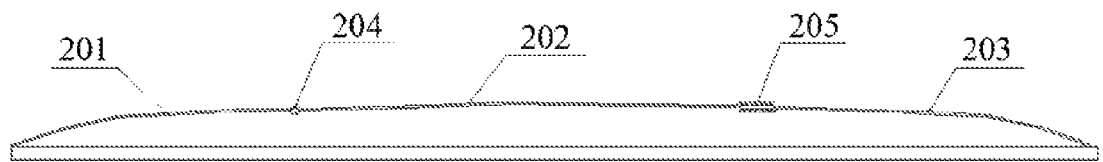
FIG. 1 is a schematic structural diagram of a three-segment back housing according to one or more embodiments of the disclosure.

One or more embodiments of the disclosure provide a back housing applicable to a display device; and FIG. 1 illustrates a schematic structural diagram of a three-segment back housing, and the back housing 2 may include at least three housing bodies which are vertically arranged, the housing bodies are connected with each other through at least two types of housing connectors including a rotating connector 204 and a sliding connector 205, and the housing connectors between the adjacent housing bodies may be one of the rotating connector 204 and the sliding connector 205, and where the rotating connector 204 may be configured to have two adjacent housing bodies connected through rotation, and the sliding connector 205 may be configured to have two adjacent housing bodies connected through sliding.

As illustrated in FIG. 1, the back housing 2 may include three housing bodies, e.g., housing bodies 201, 202 and 203, where the housing body 201 and the housing body 203 may be arranged respectively on two opposite sides of the housing body 202; and the housing body 201 and the housing body 202 may be connected through rotation by the rotating connector 204, and there may be various angles between the housing body 201 and the housing body 202 through the rotating connector 204 so that when the display device is in the planar state, the angle between the housing bodies 201 and 202 may be at the maximum critical angle, and when the display device transitions from the planar state to the curved state, the angle between the housing bodies 201 and 202 may vary with the curvature of a display screen of the display device.

In order to enable the back housing to cover liquid crystal module adjacent to the back housing and since the back housing being curved may be lengthen due to the thickness of the display device, the housing bodies 202 and 203 further need to be connected through sliding by the sliding connector 205, and the housing bodies 202 and 203 may be offset from each other through the sliding connector 205 so that when the display device is in the planar state, the amount of the offset between the housing bodies 202 and 203 may be zero, that is, there is no relative sliding between them; and when the display device transitions from the planar state to the curved state, the housing bodies 202 and 203 may be pulled by each other so that the offset between them may vary with the curvature of the display screen, and the offset between the housing bodies 202 and 203 may be increased to thereby lengthen the back housing 2 so as to accommodate the curved state of the display device. This relates to such a situation that the curved display device is curved away from the back housing. Moreover the curved display device may be curved towards the back housing, that is, the back housing may be shorten, and the same description above may also apply to this situation except for reversed operations.

Moreover when the display device transitions from being curved to being planar, a plurality of housing bodies of the back housing 2 may move together with the display device, and the housing bodies 202 and 203 may be pushed by each other to thereby decrease the amount of the offset between them so that the back housing may be shorten, and finally the back housing may resume the planar state due to rotation between the housing bodies 202 and 201.

The number of the housing bodies of the back housing may be typically three, four, five, six, seven, eight, etc., and a larger number of the housing bodies may enable the back housing to be curved at a better curvature and consequently be more aesthetically pleasing and smooth, where the number of the housing bodies may be decided by the real size of a product.

In one or more embodiments of the disclosure, the back housing 2 may include five housing bodies which are vertically arranged, where the back housing 2 may be left-and-right symmetric with respect to the central axis of the length, the central axis of the length is a central axis perpendicular to the length direction of the back housing 2 in the planar state and parallel to the width direction of the back housing 2 in the planar state.

Figure 2:
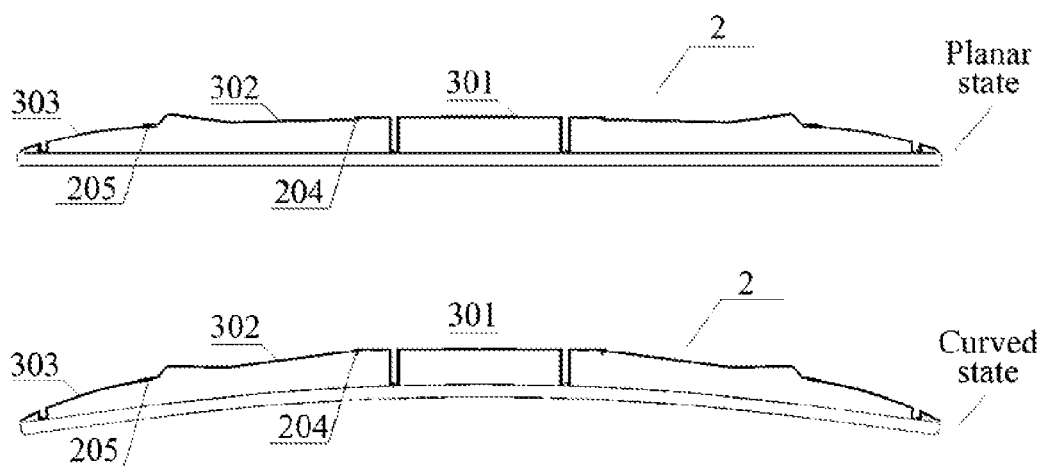
FIG. 2 is a schematic structural diagram of a five-segment back housing according to one or more embodiments of the disclosure.
Figure 3:
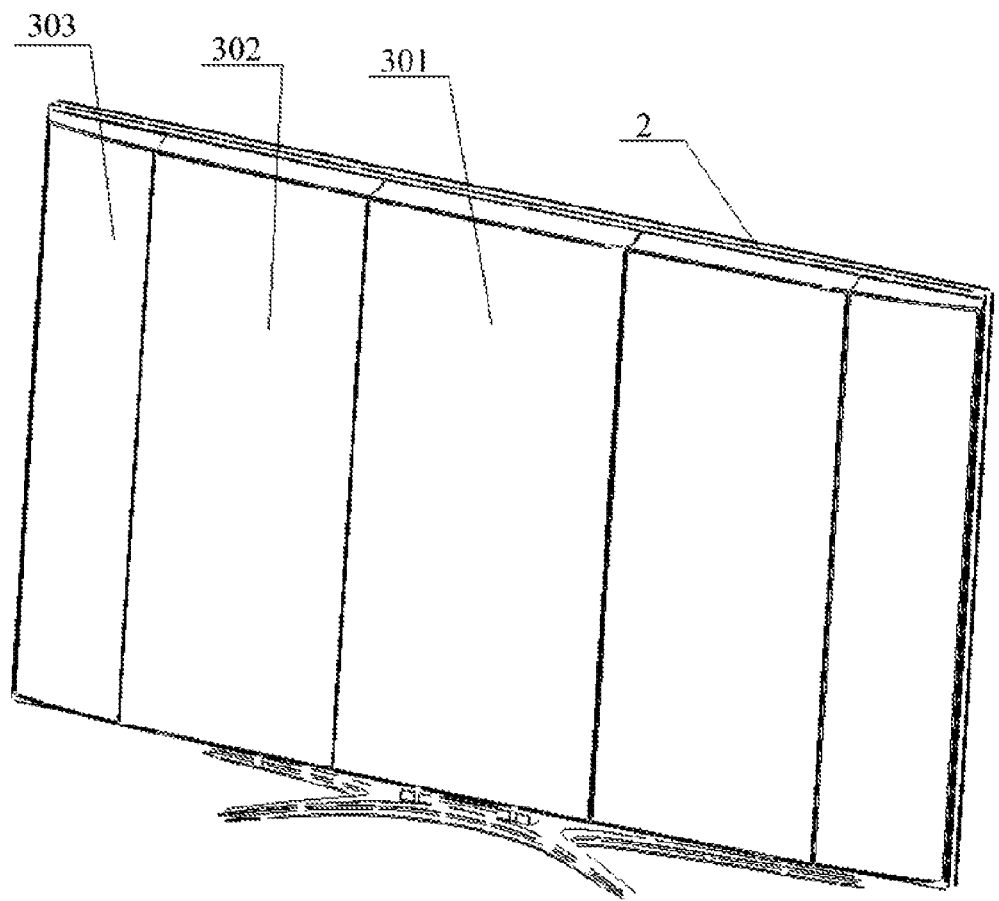
FIG. 3 is a schematic diagram of a five-segment back housing according to one or more embodiments of the disclosure.

In one or more embodiments of the disclosure, as illustrated in FIG. 2 and FIG. 3, the back housing 2 may include one inner housing body 301, two middle housing bodies 302 and two outer housing bodies 303, where the two middle housing bodies 302 may be connected respectively to two opposite sides of the inner housing body 301, and the two outer housing bodies 303 may be connected respectively to sides of the two middle housing bodies 302 away from the inner housing body 301; and at least one rotating connector 204 may be arranged between the inner housing body 301 and each of the middle housing bodies 302, and at least one sliding connector 205 may be arranged between each of the middle housing bodies 302 and each of the outer housing bodies 303.

Since a force is typically applied proximate to the outer housing bodies 303 in the curvature-adjustable display device, with the five-segment housing body, the outer housing bodies 303 are curved to the largest extent, and the middle housing bodies 302 are rotated along with the curved outer housing bodies 303 so that the inner housing body 301 and the middle housing bodies 302 may be pulled into rotation relative to each other.

Moreover alternatively at least one sliding connector 205 may be arranged between the inner housing body 301 and each of the middle housing bodies 302, and at least one rotating connector 204 may be arranged between each of the middle housing bodies 302 and each of the outer housing bodies 303; and the middle housing bodies 302 may be rotated along with the outer housing bodies 303 to thereby change the angle between them so as to result in sliding of the inner housing body 301 relative to the middle housing bodies 302, and finally the back housing may be lengthen into the curved state. The disclosure will not be limited in this regard.

Figure 4:
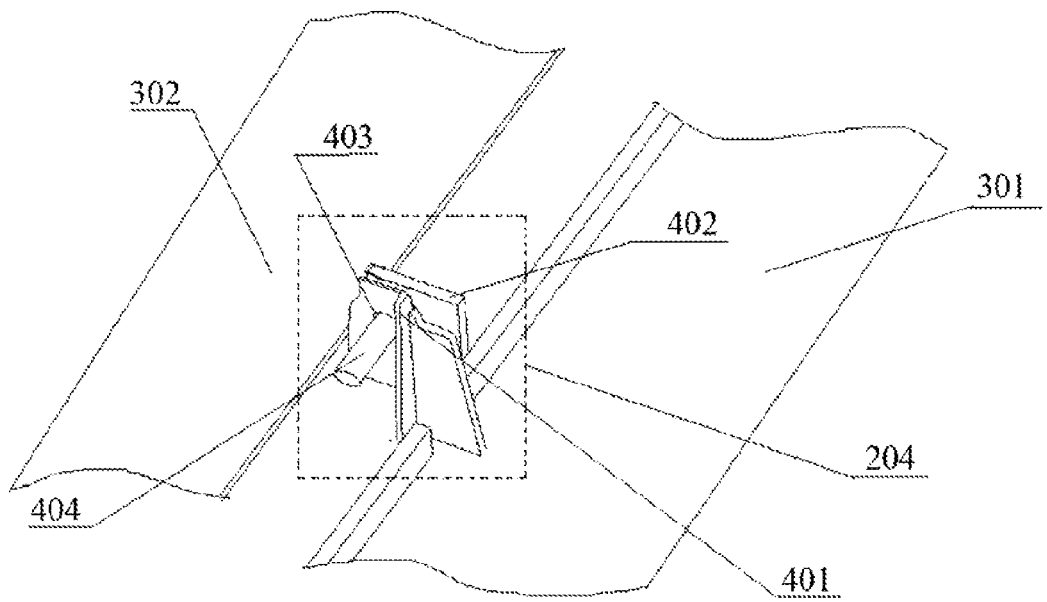
FIG. 4 is a schematic structural diagram of a rotating connector according to one or more embodiments of the disclosure.

In one or more embodiments, as illustrated in FIG. 4, the rotating connector 204 may include a first protruding ear 401 and a second protruding ear 402, where the first protruding ear 401 and the second protruding ear 402 may be arranged respectively on adjacent sides of the inner housing body 301 and the middle housing body 302, and the first protruding ear 401 and the second protruding ear 402 may be rotated relative to each other around the axis parallel to the adjacent sides of the inner housing body 301 and the middle housing body 302.

In one or more embodiments, the rotating connector may be embodied as follows: a hanging hole 403 may be arranged on the first protruding ear 401, and a first protruding post 404 matching the hanging hole 403 may be arranged on the second protruding ear 402, where the first protruding post 404 may protrude parallel to the adjacent sides of the two housing bodies, and the hanging hole 403 may be sheathed on the first protruding post 404 so that the first protruding ear 401 and the second protruding ear 402 may be rotated around the axis along which the first protruding post 404 protrudes.

Figure 5:
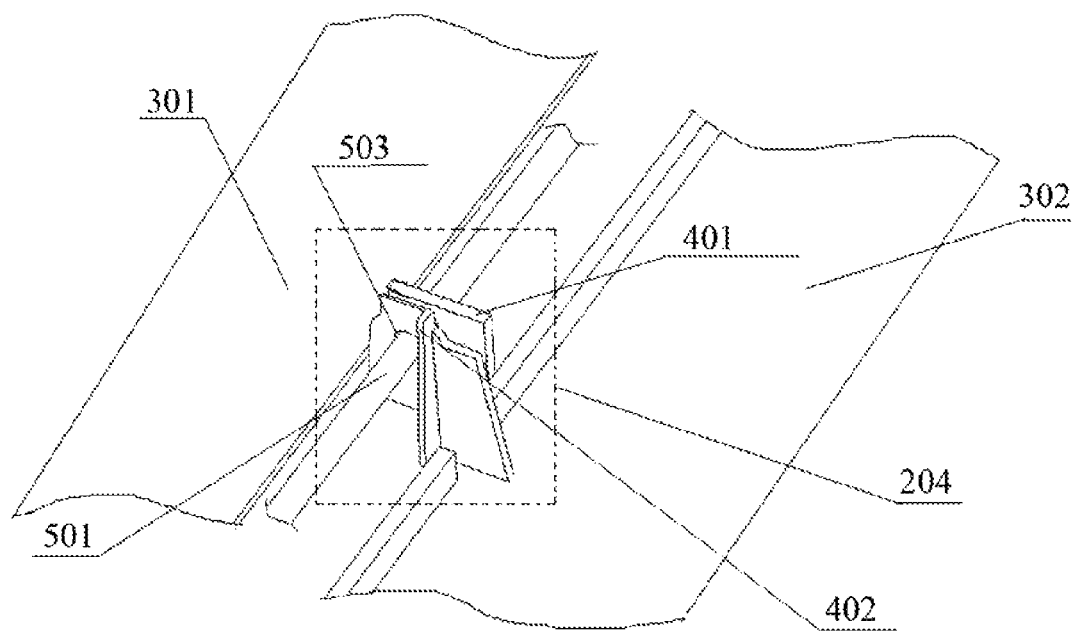
FIG. 5 is another schematic structural diagram of a rotating connector according to one or more embodiments of the disclosure.

Thus the inner housing body 301 and the middle housing body 302 may be rotated through an axial hole implemented by the hanging hole 403 and the first protruding post 404, so that there will be no possibility of other motion in any direction between the inner housing body 301 and the middle housing body 302 than their rotation relative to each other Moreover alternatively the rotating connector may be embodied otherwise, and as illustrated in FIG. 5, the rotating connector 204 may further include a rotating shaft 501, a first through-hole 502 (not illustrated) may be arranged on the first protruding ear 401, and a second through-hole 503 may be arranged on the second protruding ear 402, where the first through-hole 502 and the second through-hole 503 may be sheathed on the rotating shaft 501, and the first protruding ear 401 and the second protruding ear 402 may be rotated around the axis of the rotating shaft 501.

Thus the rotating shaft 501 may function so that axis holes of the first protruding ear 401 and the second protruding ear 402 may cooperate with each other to thereby result in rotation between the inner housing body 301 and the middle housing body 302.

Figure 6:
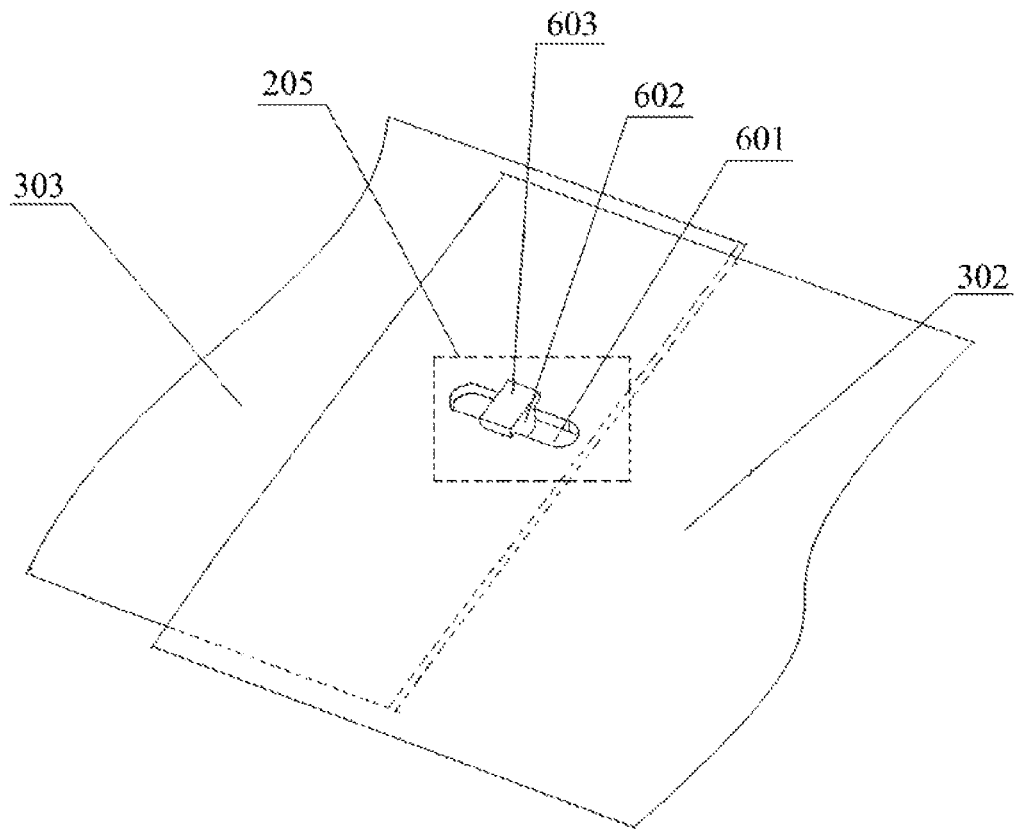
FIG. 6 is a schematic diagram of how a sliding connector slides according to one or more embodiments of the disclosure.

For the sliding connector, as illustrated in FIG. 6, in one or more embodiments of the disclosure, the sliding connector 205 may include a slide hole 601 and a sliding post 602, which may be arranged respectively on adjacent sides of the middle housing body 302 and the outer housing body 303, where the length direction of the slide hole 601 may be perpendicular to the adjacent sides of the middle housing body 302 and the outer housing body 303, the sliding post 602 may slide in the slide hole 601 along the length direction of the slide hole 601, and the slide hole 601 may cooperate with the sliding post 602 to thereby result in sliding between the middle housing body 302 and the outer housing body 303, the sliding distance may be the length of the slide hole 601, and sliding direction may be the same as the direction of the slide hole 601.

In one or more embodiments of the disclosure, in order to prevent the sliding post 602 from slipping out of the slide hole 601, a blocker 603 may be arranged at the top of the sliding post 602 to block the sliding post 602 from slipping out of the slide hole, where the width of the blocker 603 may be larger than the width of the slide hole 602, and the blocker 603 may function to limit the sliding post in place perpendicular to the surface of the back housing so that the sliding post 602 may only slide inside the groove of the sliding hole 601.

Figure 7:
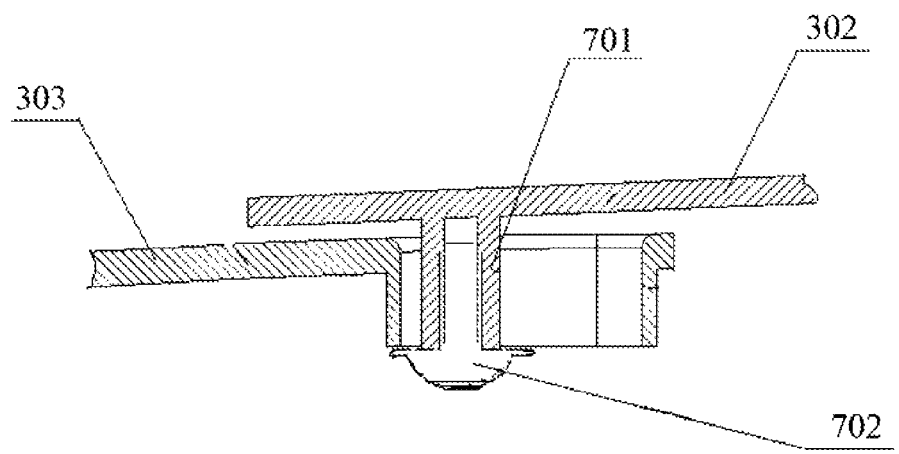
FIG. 7 is a schematic structural diagram of a sliding post in the sliding connector according to one or more embodiments of the disclosure in a sectional view.

In one or more embodiments of the disclosure, alternatively the sliding connector 205 may be embodied otherwise, for example, as illustrated in FIG. 7, the sliding post 602 may include a bolt post 701 and a sliding bolt 702 cooperating with the bolt post 701, where the diameter of the nut of the sliding bolt 702 may be larger than the width of the sliding hole 601 so that the sliding post 602 may be limited in place by the nut of the sliding bolt 702.

In one or more embodiments of the disclosure, as illustrated in FIG. 3, the display device may further include a display module, which is configured to carry the display screen and optical devices, where bolt holes may be arranged on the inner housing body 301 so that the inner housing body 301 may be connected with the display module by bolts in the bolt holes, and the back housing needs to be fastened to the display module; and in general, forces are applied to both sides of a back plate of a curvature-adjustable display device to thereby have the display device curved, so it may be easy to fasten the back housing at the proximity to the inner housing body as much as possible.

A flat panel display device may be provided with a back housing according to one or more embodiments of the disclosure, where the back housing may be adjusted in shape, length, etc.

A curved display device may be provided with a back housing according to one or more embodiments of the disclosure, where the back housing includes at least three housing bodies which are vertically arranged, and the housing bodies with segmented structure may be connected through sliding or connected through rotation by housing connectors, so that the back housing may be switched from the planar appearance into another shape and may be curved upon application of a force thereto as a result of a display module component being curved; and since the housing connectors of the back housing are a sliding connector or a rotating connector and the connectors between adjacent housing bodies are one of the rotating connector and the sliding connector, the rotating connector may have two adjacent housing bodies connected through rotation relative to each other, and the sliding connector may have two adjacent housing bodies connected through sliding relative to each other, so that the two adjacent housing bodies may be further offset from each other, thus lengthening the back housing, which may correspond to the curved state of the back housing, where the curved arc of the back housing is lengthened so that the back housing may be curved together with the display module component without having the display module exposed out of the back housing. It may not be necessary to reserve any movement gap between the back housing and the display module, thus lowering the thickness of the display device. As compared with the prior art, also the security risk of degraded reliability in fastening, due to that the display module component is exposed out of the back housing, and the drawbacks of a possible access to internal elements throughout the display device and non-dustproof of internal elements throughout the display device in the prior art may be alleviated.

Moreover one or more embodiments of the disclosure provide a back housing applicable to a display device, where the display device may be a flat panel display device or a curved display device, and furthermore the display device may be a curvature-invariable display device or a curvature-adjustable display device. The back housing may include at least three housing bodies, which are connected by connectors to constitute the back housing, where the length directions of the housing bodies are along the length direction of the back housing, the width directions of the housing bodies are along the width direction of the back housing, adjacent housing bodies are connected by the connectors, the lengths of the housing bodies are no larger than the length of the back housing, the widths of the housing bodies matches with the width of the back housing, and the thicknesses of the housing bodies are no larger than the thickness of the back housing.

In one or more embodiments of the disclosure, the connectors include a first connector and a second connector, and adjacent housing bodies are connected by at least one first connector and/or at least one second connector. Two adjacent housing bodies may be connected by only one connector or may be connected by a plurality of connectors, and when two adjacent housing bodies are connected by a plurality of connectors, all of the plurality of connectors may be the first connectors or second connectors, or a part of the plurality of the connectors may be first connectors and the another part of the plurality of the connectors may be the second connectors.

In one or more embodiments of the disclosure, the first connector is rotating connector, and the second connector is sliding connector.

In one or more embodiments of the disclosure, the back housing includes five housing bodies, where the five housing bodies include one inner housing body, two middle housing bodies and two outer housing bodies, the two outer housing bodies are connected respectively to two sides of the back housing in the width direction, the two middle housing bodies are connected respectively to two sides of the two outer housing bodies, away from the two sides of the back housing in the width direction, and the inner housing body is located between the two middle housing bodies.

Furthermore one or more embodiments of the disclosure include a display device with a back housing, where the back housing includes at least three housing bodies which are vertically arranged, the housing bodies are connected by at least two types of housing connectors including a rotating connector and a sliding connector, and the housing connector between adjacent housing bodies is one of the rotating connector and the sliding connector, and where the rotating connector is configured to have two adjacent housing bodies connected through rotation, and the sliding connector is configured to have two adjacent housing bodies connected through sliding.

In one or more embodiments, the back housing includes five housing bodies which are vertically arranged, where the back housing is left-and-right symmetric with respect to the central axis of the length of the back housing, which is a central axis perpendicular to the length direction of the back housing in the planar state and parallel to the width direction of the back housing in the planar state.

In one or more embodiments, the back housing includes one inner housing body, two middle housing bodies and two outer housing bodies, where the two middle housing bodies are connected respectively to two opposite sides of the inner housing body, and the two outer housing bodies are connected respectively to sides of the two middle housing bodies away from the inner housing body; and at least one rotating connector is arranged between the inner housing body and each of the middle housing bodies, and at least one sliding connector is arranged between each of the middle housing bodies and each of the outer housing bodies.

In one or more embodiments, the rotating connector includes a first protruding ear and a second protruding ear, where the first protruding ear and the second protruding ear are arranged respectively on adjacent sides of the inner housing body and the middle housing body, and the first protruding ear and the second protruding ear may be rotated relative to each other around the axis parallel to the sides.

In one or more embodiments, a hanging hole is arranged on the first protruding ear, and a first protruding post matching the hanging hole is arranged on the second protruding ear, where the first protruding post protrudes parallel to the sides, and the hanging hole may be sheathed on the first protruding post so that the first protruding ear and the second protruding ear may be rotated around the axis along which the first protruding post protrudes.

In one or more embodiments, the rotating connector further includes a rotating shaft, a first through-hole is arranged on the first protruding ear, and a second through-hole is arranged on the second protruding ear, where the first through-hole and the second through-hole are sheathed on the rotating shaft, and the first protruding ear and the second protruding ear may be rotated around the axis of the rotating shaft.

In one or more embodiments, the sliding connector includes a slide hole and a sliding post, which are arranged respectively on adjacent sides of the middle housing body and the outer housing body, where the length direction of the slide hole is perpendicular to the sides, and the sliding post may slide in the slide hole along the length direction of the slide hole.

In one or more embodiments, a blocker is arranged at the top of the sliding post to block the sliding post from slipping out of the slide hole.

In some embodiments, the sliding post includes a bolt post and a sliding bolt cooperating with the bolt post, where the diameter of the nut of the sliding bolt is larger than the width of the sliding hole.

In one or more embodiments, the display device further includes a display module configured to carry a display screen and optical devices, where bolt holes are arranged on the inner housing body so that the inner housing body may be connected with the display module by bolts.

Moreover one or more embodiments of the disclosure further provide a display device with a back housing, where the back housing includes at least three housing bodies, which are connected by connectors to constitute the back housing, the length directions of the housing bodies are along the length direction of the back housing, the width directions of the housing bodies are along the width direction of the back housing, adjacent housing bodies are connected by the connectors, the lengths of the housing bodies are no larger than the length of the back housing, the widths of the housing bodies match with the width of the back housing, and the thicknesses of the housing bodies are no larger than the thickness of the back housing.

In one or more embodiments of the disclosure, the connectors include a first connector and a second connector, and adjacent housing bodies are connected by at least one first connector and/or at least one second connector.

In one or more embodiments of the disclosure, the first connector is a rotating connector, and the second connector is a sliding connector.

In one or more embodiments of the disclosure, the rotating connector includes a first protruding ear and a second protruding ear, where the first protruding ear and the second protruding ear are arranged respectively on adjacent sides of the inner housing body and the middle housing body, and the first protruding ear and the second protruding ear may be rotated relative to each other around the axis parallel to the sides.

In one or more embodiments of the disclosure, the sliding connector includes a slide hole and a sliding post, which are arranged respectively on adjacent sides of the middle housing body and the outer housing body, where the length direction of the slide hole is perpendicular to the adjacent sides, and the sliding post may slide in the slide hole along the length direction of the slide hole.

In one or more embodiments of the disclosure, the back housing includes five housing bodies, where the five housing bodies include one inner housing body, two middle housing bodies and two outer housing bodies, the two outer housing bodies are connected respectively to two sides of the back housing in the width direction, the two middle housing bodies are connected respectively to two sides of the two outer housing bodies, away from the two sides of the back housing in the width direction, and the inner housing body is located between the two middle housing bodies.

In one or more embodiments of the disclosure, the segmented structure of the back housing may function together with the housing connectors, for example sliding or rotating connectors, so that the rotating connectors may have the angle between two adjacent housing bodies adjustable so as to have the back housing visually appear in the curved state, and so that the sliding connectors may cause a relative offset between the adjacent housing bodies to thereby lengthen the back housing. During being curved, the back housing may be curved to be deformed together with the other components of the display device and may cover the other components while being curved without having the other components exposed, so it may not be necessary to reserve any movement gap for the other components, thus avoiding the display device from being thickened. In the meantime, the other components are fastened to the back housing all the time to thereby alleviate the security risk of degraded reliability in fastening the other components exposed out of the back housing and avoid the drawbacks of a possible access to elements internal to the display device and non-dustproof of elements internal to the display device.

It shall be noted that the curvature-adjustable display device may be a TV set, a display, a medical display device, a tablet computer and any other product or component with a display function, for example.

It shall be noted that the housing connectors above, i.e., the sliding connector and the rotating connector may be made of a metal material or a plastic material, but the disclosure will not be limited in this regard, and any material with which the technical effect of the present solution will fall into the scope of the disclosure.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A back housing applicable to a display device, the back housing comprises at least three housing bodies which are vertically arranged, the housing bodies are connected by at least two types of housing connectors comprising a rotating connector and a sliding connector, and the housing connector between adjacent housing bodies is one of the rotating connector and the sliding connector, and the rotating connector is configured to have two adjacent housing bodies connected through rotation, and the sliding connector is configured to have two adjacent housing bodies connected through sliding.

2. The back housing according to claim 1, wherein the back housing comprises five housing bodies which are vertically arranged, and the back housing is left-and-right symmetric with respect to a central axis of a length of the back housing, which is a central axis perpendicular to a length direction of the back housing in a planar state and parallel to a width direction of the back housing in the planar state.

3. The back housing according to claim 2, wherein the back housing comprises one inner housing body, two middle housing bodies and two outer housing bodies, the two middle housing bodies are connected respectively to two opposite sides of the inner housing body, and the two outer housing bodies are connected respectively to sides of the two middle housing bodies away from the inner housing body; and at least one rotating connector is arranged between the inner housing body and each of the middle housing bodies, and at least one sliding connector is arranged between each of the middle housing bodies and each of the outer housing bodies.

4. The back housing according to claim 3, wherein the rotating connector comprises a first protruding ear and a second protruding ear, the first protruding ear and the second protruding ear are arranged respectively on adjacent sides of the inner housing body and the middle housing bodies, and the first protruding ear and the second protruding ear can be rotated relative to each other around the axis parallel to the sides.

5. The back housing according to claim 4, wherein a hanging hole is arranged on the first protruding ear, a first protruding post matching the hanging hole is arranged on the second protruding ear, the first protruding post protrudes parallel to the sides, and the hanging hole can be sheathed on the first protruding post so that the first protruding ear and the second protruding ear can be rotated around an axis along which the first protruding post protrudes.

6. The back housing according to claim 4, wherein the rotating connector further comprises a rotating shaft, a first through-hole is arranged on the first protruding ear, a second through-hole is arranged on the second protruding ear, the first through-hole and the second through-hole are sheathed on the rotating shaft, and the first protruding ear and the second protruding ear can be rotated around an axis of the rotating shaft.

7. The back housing according to claim 3, wherein the sliding connector comprises a slide hole and a sliding post, which are arranged respectively on adjacent sides of the middle housing body and the outer housing body, a length direction of the slide hole is perpendicular to the sides, and the sliding post can slide in the slide hole along the length direction of the slide hole.

8. The back housing according to claim 7, wherein a blocker is arranged at the top of the sliding post to block the sliding post from slipping out of the slide hole.

9. The back housing according to claim 7, wherein the sliding post comprises a bolt post and a sliding bolt cooperating with the bolt post, and a diameter of a nut of the sliding bolt is larger than a width of the sliding hole.

10. The back housing according to claim 3, wherein the display device further comprises a display module configured to carry a display screen and optical devices, and bolt holes are arranged on the inner housing body so that the inner housing body can be connected with the display module by bolts.

11. A back housing applicable to a display device, the back housing comprises at least three housing bodies, which are connected by connectors to constitute the back housing, length directions of the housing bodies are along a length direction of the back housing, width directions of the housing bodies are along a width direction of the back housing, adjacent housing bodies are connected by the connectors, lengths of the housing bodies are no larger than a length of the back housing, widths of the housing bodies match with a width of the back housing, and thicknesses of the housing bodies are no larger than a thickness of the back housing.

12. The back housing according to claim 11, wherein the connectors comprise a first connector and a second connector, and adjacent housing bodies are connected by at least one first connector and/or at least one second connector.

13. The back housing according to claim 12, wherein the first connector is a rotating connector, and the second connector is a sliding connector.

14. The back housing according to claim 13, wherein the back housing comprises five housing bodies, the five housing bodies comprise one inner housing body, two middle housing bodies and two outer housing bodies, the two outer housing bodies are connected respectively to two sides of the back housing in the width direction, the two middle housing bodies are connected respectively to two sides of the two outer housing bodies, away from the two sides of the back housing in the width direction, and the inner housing body is located between the two middle housing bodies.

15. A display device with a back housing, wherein the back housing comprises at least three housing bodies, which are connected by connectors to constitute the back housing, length directions of the housing bodies are along a length direction of the back housing, width directions of the housing bodies are along a width direction of the back housing, adjacent housing bodies are connected by the connectors, lengths of the housing bodies are no larger than a length of the back housing, widths of the housing bodies match with a width of the back housing, and thicknesses of the housing bodies are no larger than a thickness of the back housing.

16. The display device according to claim 15, wherein the connectors comprise a first connector and a second connector, and adjacent housing bodies are connected by at least one first connector and/or at least one second connector.

17. The display device according to claim 16, wherein the first connector is a rotating connector, and the second connector is a sliding connector.

18. The display device according to claim 17, wherein the rotating connector comprises a first protruding ear and a second protruding ear, the first protruding ear and the second protruding ear are arranged respectively on adjacent sides of the adjacent housing bodies, and the first protruding ear and the second protruding ear can be rotated relative to each other around the axis parallel to the sides.

19. The display device according to claim 17, wherein the sliding connector comprises a slide hole and a sliding post, which are arranged respectively on adjacent sides of the adjacent housing bodies, a length direction of the slide hole is perpendicular to the sides, and the sliding post can slide in the slide hole along the length direction of the slide hole.

20. The display device according to claim 15, wherein the back housing comprises five housing bodies, the five housing bodies comprise one inner housing body, two middle housing bodies and two outer housing bodies, the two outer housing bodies are connected respectively to two sides of the back housing in the width direction, the two middle housing bodies are connected respectively to two sides of the two outer housing bodies, away from the two sides of the back housing in the width direction, and the inner housing body is located between the two middle housing bodies.

* * * * *